(12) United States Patent
Harris et al.

(10) Patent No.: US 11,662,416 B2
(45) Date of Patent: May 30, 2023

(54) REAL-TIME COMPENSATION OF HIGH-ORDER CONCOMITANT MAGNETIC FIELDS

(71) Applicant: Synaptive Medical Inc., Toronto (CA)

(72) Inventors: Chad Harris, Toronto (CA); Geron Bindseil, Toronto (CA); Andrew T. Curtis, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 0 days.

(21) Appl. No.: 17/561,890

(22) Filed: Dec. 24, 2021

(65) Prior Publication Data

US 2022/0120837 A1 Apr. 21, 2022

Related U.S. Application Data

(63) Continuation of application No. 16/590,979, filed on Oct. 2, 2019, now Pat. No. 11,243,287.

(51) Int. Cl.
*G01R 33/565* (2006.01)
*G01R 33/3875* (2006.01)

(52) U.S. Cl.
CPC ... *G01R 33/56581* (2013.01); *G01R 33/3875* (2013.01)

(58) Field of Classification Search
CPC ............ G01R 33/56581; G01R 33/3875
USPC ............................................. 324/309
See application file for complete search history.

(56) References Cited

U.S. PATENT DOCUMENTS

| | | | | |
|---|---|---|---|---|
| 5,877,629 | A * | 3/1999 | King | G01R 33/56554 324/309 |
| 5,917,323 | A * | 6/1999 | Du | G01R 33/56581 324/309 |
| 6,107,800 | A | 8/2000 | Claasen-Vujcic et al. | |
| 10,254,362 | B2 * | 4/2019 | Mathieu | G01R 33/3875 |
| 2004/0113615 | A1 | 6/2004 | Bammer et al. | |
| 2007/0279060 | A1* | 12/2007 | Dannels | G01R 33/56563 324/320 |
| 2009/0309596 | A1* | 12/2009 | Feiweier | G01R 33/385 324/313 |
| 2010/0001727 | A1 | 1/2010 | Frydman et al. | |
| 2014/0184222 | A1* | 7/2014 | Seeber | G01R 33/3875 324/318 |
| 2014/0184226 | A1* | 7/2014 | Seeber | G01R 33/3875 324/322 |

(Continued)

OTHER PUBLICATIONS

Zhou XJ et al, "Concomitant Magnetic-Field-Induced Artifacts in Axial Echo Planar Imaging" MRM 39:596-605 (1998).

(Continued)

*Primary Examiner* — Christopher P McAndrew
(74) *Attorney, Agent, or Firm* — Ridout & Maybee LLP

(57) ABSTRACT

A method, electromagnet device, and system for reducing a higher order term of a concomitant field in an imaging magnetic field during magnetic resonance imaging is described. The electromagnet system has a first shim coil configured to be driven to generate a first compensation magnetic field during imaging according to a first second-order compensation term, the first compensation magnetic field having a similar amplitude but opposite direction as that of a first second-order concomitant magnetic field.

10 Claims, 6 Drawing Sheets

(56) References Cited

U.S. PATENT DOCUMENTS

2014/0327440 A1* 11/2014 Nakanishi .......... G01R 33/3875
　　　　　　　　　　　　　　　　　　　　324/309
2017/0123026 A1* 5/2017 Mathieu ........... G01R 33/56563

OTHER PUBLICATIONS

Meier C, "Concomitant Field Terms for Asymmetric Gradient Coils: Consequences for Diffusion, Flow, and Echo-Planar Imaging" MRM 60:128-134 (2008).

Bernstein MA et al, "Concomitant Gradient Terms in Phase Contrast MR: Analysis and Correction" MRM 39:300-308 (1998).

Zhou XJ et al, "Artifacts Induced by Concomitant Magnetic Field in Fast Spin-Echo Imaging" MRM 40:582-591 (1998).

Harris, Chad et al, "A New Approach to Shimming: The Dynamically Controlled Adaptive Current Network" MRM 71:859-869 (2014).

Littin, Sebastian et al. "Development and Implementation of an 84-Channel Matrix Gradient Coil" MRM 79:1181-1191 (2018).

Search Report issued by the IPO of the UK in relation to GB App. No. GB2015620.4 dated Mar. 11, 2021.

* cited by examiner

REAL-TIME COMPENSATION OF HIGH-ORDER CONCOMITANT MAGNETIC FIELDS

CROSS-REFERENCE TO RELATED APPLICATION

This application is a continuation of U.S. patent application Ser. No. 16/590,979 filed Oct. 2, 2019, titled REAL-TIME COMPENSATION OF HIGH-ORDER CONCOMITANT MAGNETIC FIELDS, the contents of which are hereby expressly incorporated into the present application by reference in their entirety.

FIELD

The present disclosure is related to systems and methods for magnetic resonance. More particularly, the disclosure relates to systems and methods for concomitant field correction and compensation.

BACKGROUND

Magnetic resonance imaging (MRI) is generally performed with very strong static magnetic fields. The static magnetic field, also referred to as the "main field" or "B0 field", is responsible for polarizing nuclei and is required for imaging during nuclear magnetic resonance.

Due to Maxwell's equations, whenever a linear gradient field is produced, e.g. for spatial encoding, it is accompanied by secondary or second-order field terms, typically known as second order concomitant magnetic fields or just concomitant fields. Depending on the gradient coil design, the zeroth and first order terms can be eliminated. However, the higher-order distortion terms (i.e., 2nd order and above) are usually unavoidable.

The higher-order concomitant magnetic fields can lead to phase errors, signal dropout, and/or imaging artefacts that are undesirable. These problems become of greater importance as the gradient strength of an imaging sequence is increased and/or the main magnetic field strength of an MR system is decreased.

Thus, there remains a need to provide systems and methods for reducing or otherwise eliminating higher-order concomitant magnetic field in magnetic resonance systems.

SUMMARY

In some examples, the present disclosure provides a magnetic resonance imaging (MRI) system comprising: an electromagnet system for reducing a higher order term of a concomitant field in an imaging magnetic field during magnetic resonance imaging, the electromagnet system having: a first shim coil configured to be driven to generate a first compensation magnetic field during imaging according to a first second-order compensation term, the first compensation magnetic field having a similar amplitude but opposite direction as that of a first second-order concomitant magnetic field.

In some examples, the present disclosure provides a method for reducing a higher order term of a concomitant field in an imaging magnetic field during magnetic resonance imaging, the method comprising: generating a first compensation magnetic field with a first shim coil during imaging according to a first second-order compensation term, the first compensation magnetic field having a similar amplitude but opposite direction as that of a first second-order concomitant magnetic field.

In some examples, the present disclosure provides an electromagnet for reducing a higher order term of a concomitant field in an imaging magnetic field during magnetic resonance imaging, the electromagnet configured to be driven to generate a first compensation magnetic field during imaging according to a first second-order compensation term, the first compensation magnetic field having a similar amplitude but opposite direction as that of a first second-order concomitant magnetic field.

The foregoing and other aspects and advantages of the present disclosure will appear from the following description. In the description, reference is made to the accompanying drawings that form a part hereof, and in which there is shown by way of illustration a preferred embodiment. Such embodiment does not necessarily represent the full scope of the disclosure, however, and reference is made therefore to the claims and herein for interpreting the scope of the disclosure.

BRIEF DESCRIPTION OF THE DRAWINGS

Reference will now be made, by way of example, to the accompanying drawings which show example embodiments of the present application, and in which.

DETAILED DESCRIPTION

Described herein are systems, devices, and methods for reducing higher order terms (i.e., 2nd order or higher) of a concomitant field in an imaging magnetic field during magnetic resonance imaging. Inhomogeneities present in the imaging magnetic field of a magnetic resonance imaging system are often mitigated or removed via a shimming process.

Figure 1:
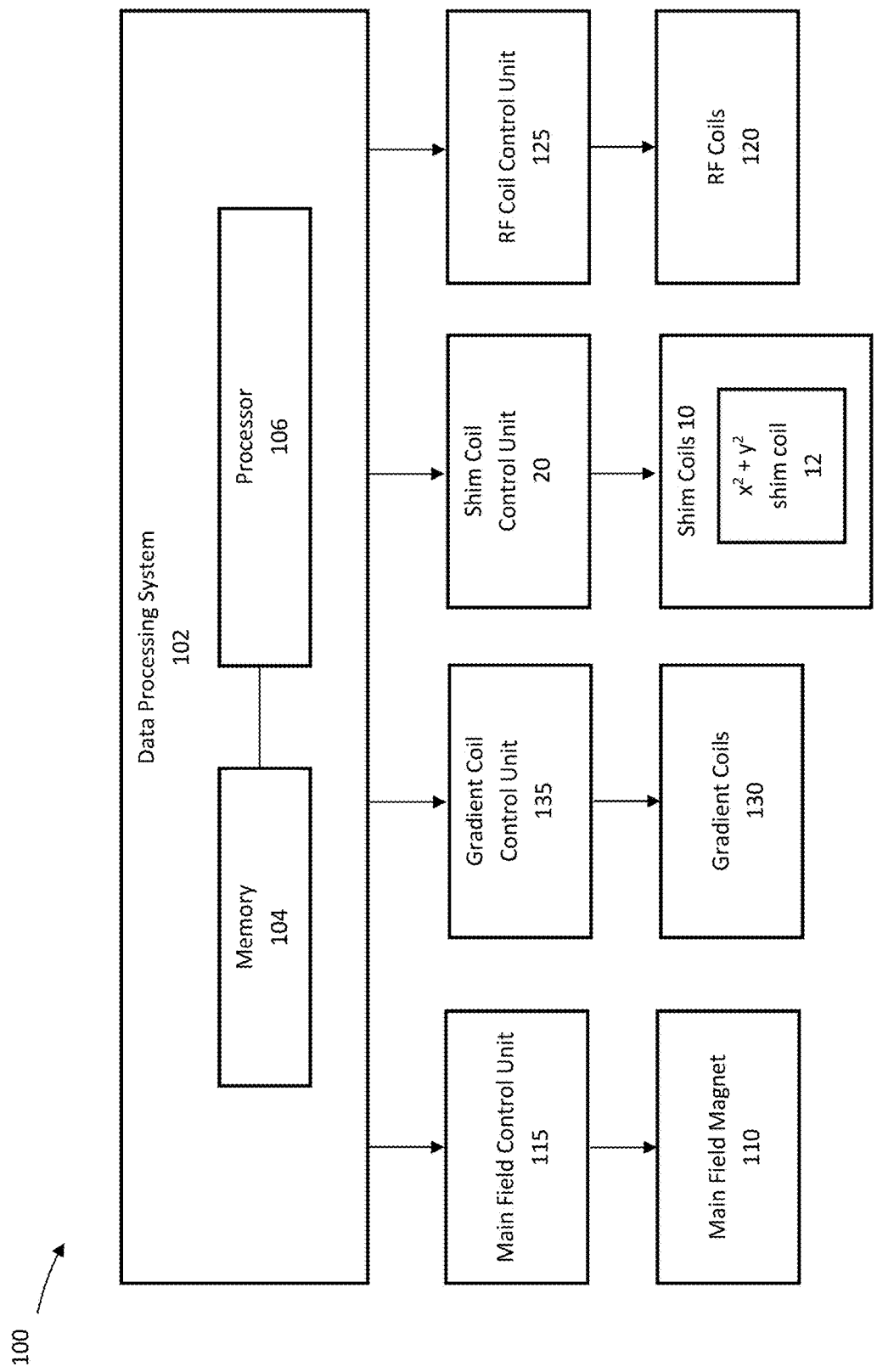
FIG. 1 is a block diagram of a magnetic resonance imaging (MRI) system in accordance with an example embodiment of the present disclosure.

Referring to FIG. 1, a block diagram of an example magnetic resonance imaging (MRI) system is shown at 100 in accordance with an example embodiment. The example implementation of MRI system indicated at 100 is for illustrative purposes only, and variations including additional, fewer and/or varied components are possible.

As shown in FIG. 1, the illustrative MRI system 100 comprises a data processing system 102. The data processing system 102 can generally include one or more output devices such as a display, one or more input devices such as a keyboard and a mouse as well as one or more processors connected to a memory having volatile and persistent components. The data processing system 102 may further comprise one or more interfaces adapted for communication and data exchange with the hardware components of MRI system 100 used for performing a scan. As shown, data processing system 102 includes a memory 104 and a processor 106 for controlling the communication and data exchange with the hardware components.

Continuing with FIG. 1, example MRI system 100 also includes a main field magnet 110. The main field magnet 110 may be implemented as a permanent, superconducting or a resistive magnet, for example. Other magnet types, including hybrid magnets suitable for use in MRI system 100 are contemplated. Main field magnet 110 is operable to produce a substantially uniform main magnetic field having strength B0 and a direction along an axis. The main magnetic field is used to create an imaging volume therein within which desired atomic nuclei, such as the protons in hydrogen within water and fat, of an object are magnetically aligned in preparation for a scan. In some implementations, as in this example implementation, a main field control unit 115 in communication with data processing system 105 may be used for controlling the operation of main field magnet 110.

The MRI system 100 further includes radio frequency (RF) coils 120. The RF coils 120 are used to establish an RF magnetic field with strength B1 to excite the atomic nuclei or "spins". The RF coils 120 can also detect signals emitted from the "relaxing" spins within the object being imaged. Accordingly, the RF coils 120 may be in the form of separate transmit and receive coils or a combined transmit and receive coil with a switching mechanism for switching between transmit and receive modes.

The RF coils 120 may be implemented as surface coils, which are typically receive only coils and/or volume coils which can be receive and transmit coils. RF coils 120 can be integrated in the main field magnet 110 bore. Alternatively, RF coils 120 may be implemented in closer proximity to the object to be scanned, such as a head, and can take a shape that approximates the shape of the object, such as a close-fitting helmet. An RF coil control unit 125 in communication with data processing system 102 may be used to control the operation of the RF coils 120 in either a transmit aspect or a receive aspect.

To obtain images from the MRI system 100, one or more sets of RF pulses and gradient waveforms (collectively called "pulse sequences") are selected at the data processing system 102. The data processing system 102 communicates the selected pulse sequence information to the RF control unit 125 and one or more gradient coil systems, discussed in more detail below, which collectively generate the associated waveforms and timings for providing a sequence of pulses to perform a scan.

The gradient coil system includes gradient coils 130, which produce controlled and uniform linear gradients with the main magnetic field. For example, gradient coils 130 may include three orthogonal current-carrying gradient coils, the x gradient coil, the y gradient coil, and the z gradient coil. When there are three orthogonal gradient axes, each gradient coil 130 may be configured to generate a magnetic field that varies linearly along one of the three gradient axes. Along with the main field magnet 110, gradient coils 130 may be designed to produce a desired linear-gradient magnetic field along each x, y, and z axis. Each gradient coil 130 may be used individually or in combination with one another.

In addition to allowing spatial excitation, gradient coils 130 may attach spatially specific frequency and phase information to the atomic nuclei placed within the imaging volume, allowing the resultant MR signal to be reconstructed into a useful image. A gradient coil control unit 135, in communication with data processing system 102, is used to control the operation of gradient coils 130. Generally, the imaging volume may be defined as the region in which MR images of interest are obtained using the MRI apparatus. The imaging volume may be a spherical volume that is smaller than the total volume of space within gradient coils 130.

In the present embodiment, MRI system 100 further includes shim coils 10 and a shim coil control unit 20 in communication with data processing system 105. Shim coil control unit 20 may be used for controlling the operation of shim coils 10.

Conventionally, MRI systems have three basic linear gradient coils 130 which generate the x, y, and z gradient fields. In order to correct for linear spatial variations in the x, y, and z gradient fields, first order shimming is usually accomplished by adjusting the dynamic current through gradient coils 130, so no additional hardware may be required to compensate for first-order concomitant fields. In that regard, gradient coils 130 may serve a dual function as gradient coils and as "first-order shim coils" in MRI system 100.

In an alternate application, for example, if the fields generated by gradient coils 130 are not sufficiently linear, the first-order linear shim coils may be physically separate from gradient coils 130.

However, as noted above, higher-order non-linear field terms are often present. Such higher-order terms includes secondary field terms or second order terms, which represent second-order concomitant fields. Unlike first-order spatial variations, second-order concomitant fields are not linear, but are rather a square term or a product of two spatial directions. For example, second order yz and zx concomitant fields have spatial variations that are formed by taking the product of a linear variation along the z-direction, multiplied by a linear variation along the y- or x-direction respectively. The $z^2$ concomitant fields have spatial variations along a curve represented by the $z^2$ function. "Secondary field terms" and "second-order terms" may be used interchangeably depending on context. To compensate, active shimming of these second-order concomitant fields often requires an additional electromagnet system, or additional shim coils.

In an example implementation, a main magnetic field may be represented as B=Bo+three linear terms+five $2^{nd}$ order terms+seven 3rd order terms + . . . , or more specifically:

$$B = B_0 + G_x x + G_y y + G_z z + \frac{1}{8B_0} G_z^2 x^2 + \frac{1}{8B_0} G_z^2 y^2 +$$

$$\frac{1}{2B_0}[G_x^2 + G_y^2]z^2 - \frac{1}{2B_0} G_y G_z yz - \frac{1}{2B_0} G_x G_z xz + \ldots$$

Some of the terms may be small or zero. For example, if only a y gradient is on (Gy), then the Gx and Gz terms are probably very small or zero, while other higher terms may be present which are not zero.

In that regard, shim coils 10 of MRI system 100 may also include second-order (or higher) shim coils. As shown in FIG. 1, shim coils 10 may include an $x^2+y^2$ shim coil 12. Other second-order shim coils that may form part of MRI system 100 include a $z^2$ shim coil, a zx shim coil, and an yz shim coil. Each of these shim coils may be present in MRI system 100 individually or be present in combination with one or more of the other second, or higher, order shim coils to correct for concomitant magnetic fields.

In alternate applications, rather than a specific electromagnet, or specific shim coil, the second-order shim coil(s) may instead be an "adaptable shim coil", or a "matrix coil". A matrix coil or adaptable shim coil is a matrix of electromagnet units that can be controlled independently of one another, and may be implemented in a number of different ways. The matrix coil, thus, would be configurable in real-time to produce the desired spatial field pattern. Further discussion of matrix coils can be found in Harris et al., "A New Approach to Shimming: The Dynamically Controlled Adaptive Current Network" *Magnetic Resonance in Medicine,* 71:859-869 (2014); and in Littin et al., "Development and Implementation of an 84-Channel Matrix Gradient Coil" *Magnetic Resonance in Medicine,* 79:1181-1191 (2018), both of which are incorporated herein by reference.

Figure 2:
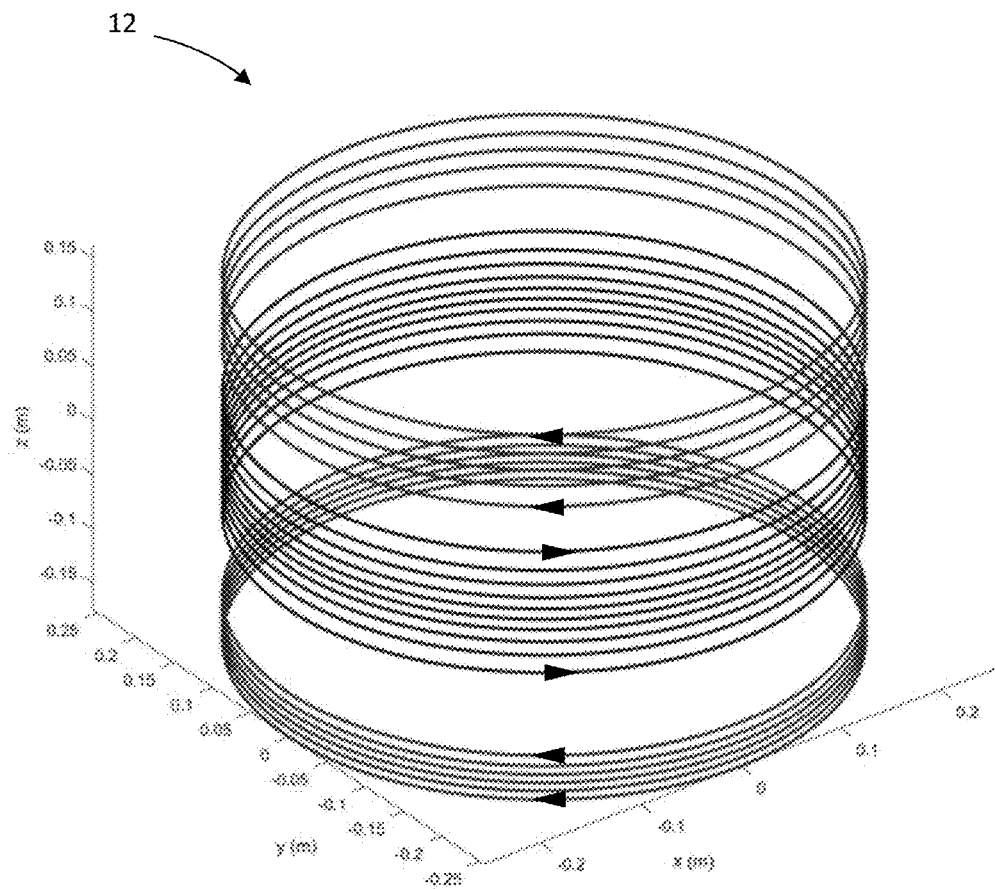
FIG. 2 is a schematic of an electromagnet according to an example embodiment of the present disclosure for reducing a higher order term of a concomitant field in an imaging magnetic field during magnetic resonance imaging.

FIG. 2 illustrates an example wire pattern for $x^2+y^2$ shim coil 12. The arrows represent an example current direction through $x^2+y^2$ shim coil 12. The second-order shim coils, including the $x^2+y^2$ shim coil 12, may be designed in such a way as to reduce coupling between gradient coils 130 and shim coils 10, discussed further below.

Figure 3:
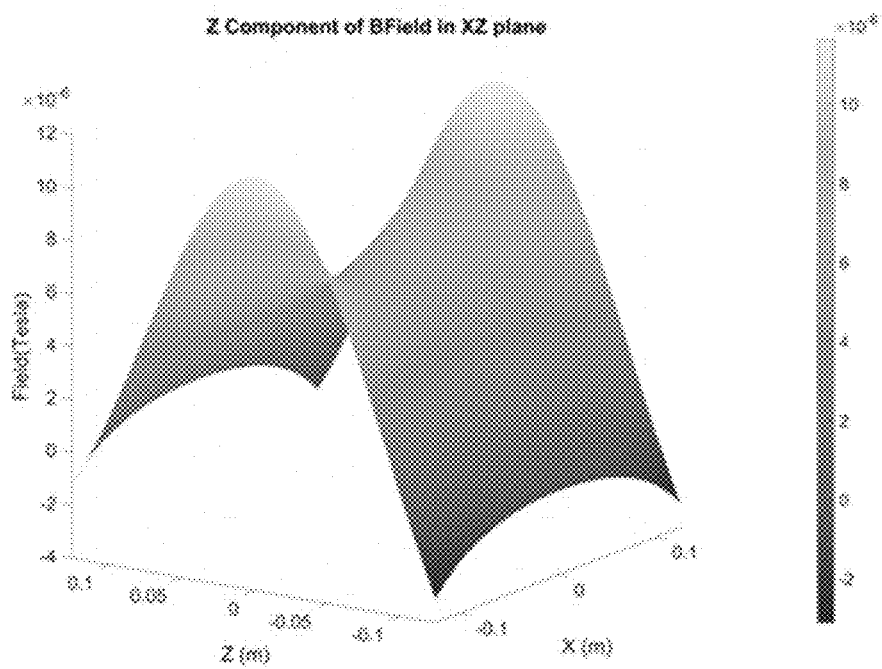
FIG. 3 illustrates the z-component of the magnetic field in the xz-plane that the wire pattern shown in FIG. 2 produces.
Figure 4:
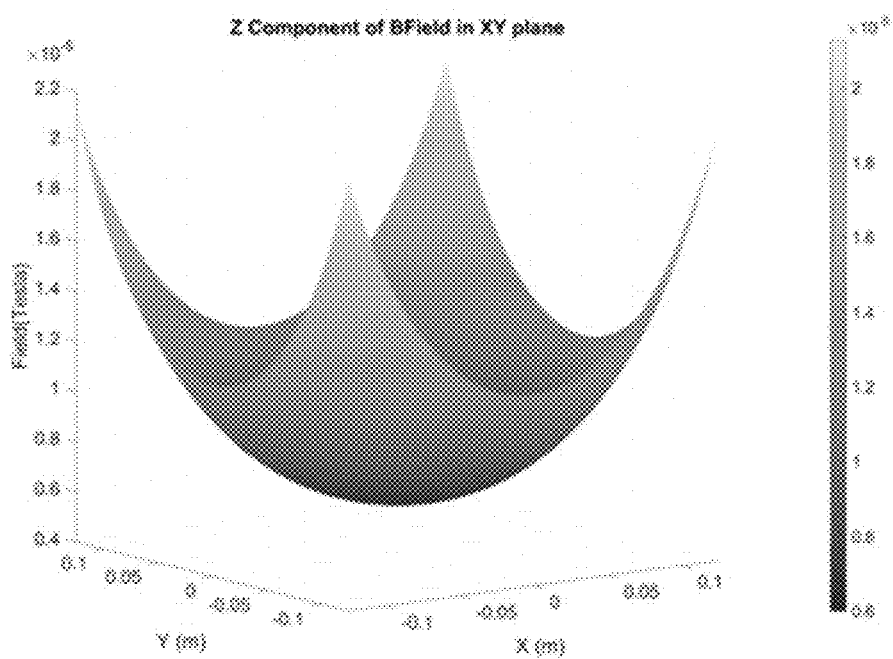
FIG. 4 illustrates the z-component of the magnetic field in the xy-plane that the wire pattern shown in FIG. 2 produces.

FIG. 3 is a graph illustrating the z-component of the magnetic field in the xz-plane that the wire pattern of FIG. 2 produces. FIG. 4 is a graph illustrating the z-component of the magnetic field in the xy-plane that the wire pattern of FIG. 2 produces.

$x^2+y^2$ shim coil 12 is configured to be driven to generate a first compensation magnetic field during imaging according to a first compensation term. When the z gradient coil is driven, as noted in the above equation, the first compensation term may be:

$$(G_z^2)/(8*B0)$$

In that regard, the first compensation magnetic field has a similar amplitude, but is opposite in direction, to that of the concomitant magnetic field with an $x^2+y^2$ spatial variation.

While one example of the wire pattern for $x^2+y^2$ shim coil 12 is shown, $x^2+y^2$ shim coil 12 may have other designs and/or wire patterns to generate the first compensation term and to help correct the concomitant magnetic field with the $x^2+y^2$ spatial variation.

In a similar manner as $x^2+y^2$ shim coil 12, the $z^2$ shim coil is designed to help correct the concomitant magnetic field with a $z^2$ spatial variation, the zx shim coil is designed to help correct the concomitant magnetic field with a zx spatial variation, and the yz shim coil is designed to help correct the concomitant magnetic field with a yz spatial variation.

Figure 5:
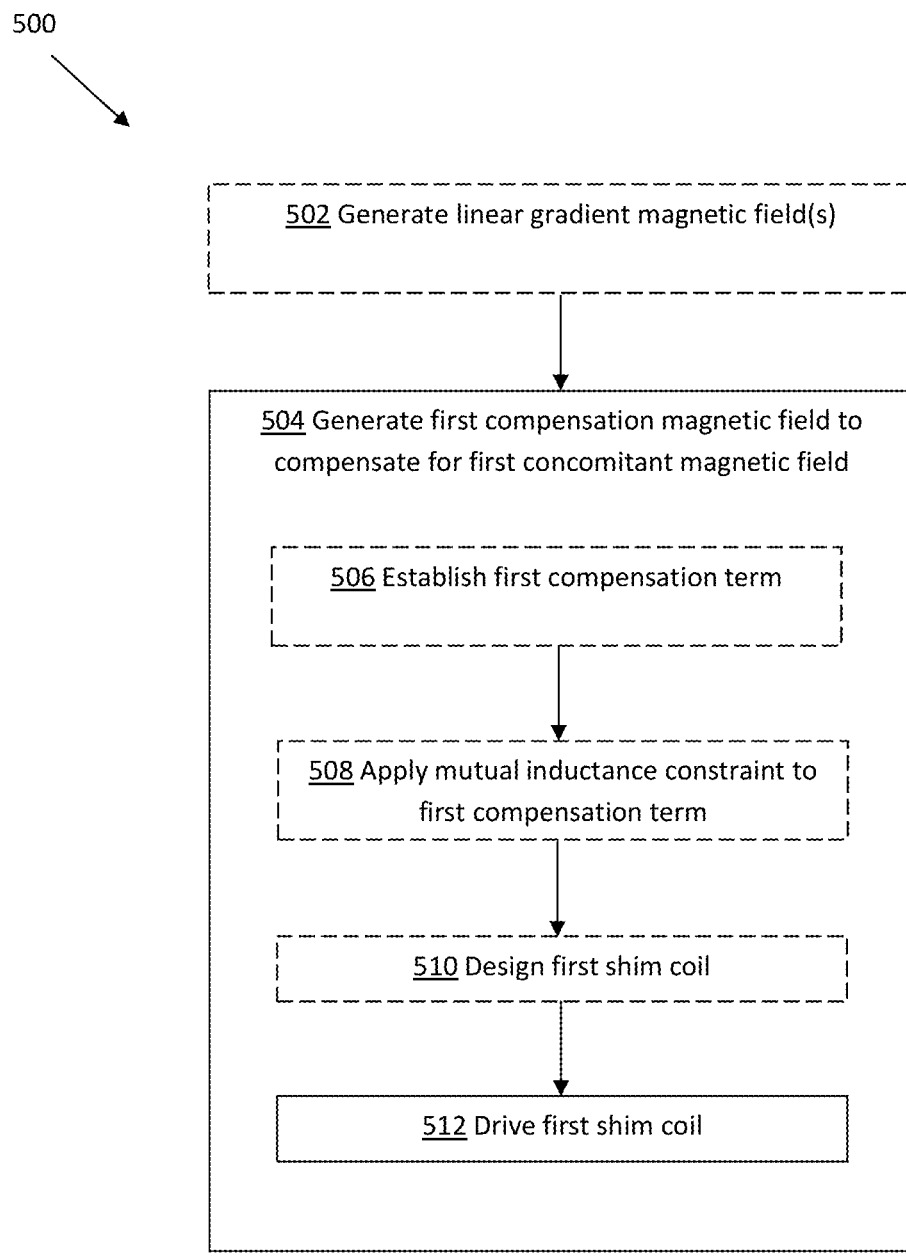
FIG. 5 is a flowchart setting forth the steps of an example method for reducing a higher order term of a concomitant field in an imaging magnetic field during magnetic resonance imaging.
Figure 6:
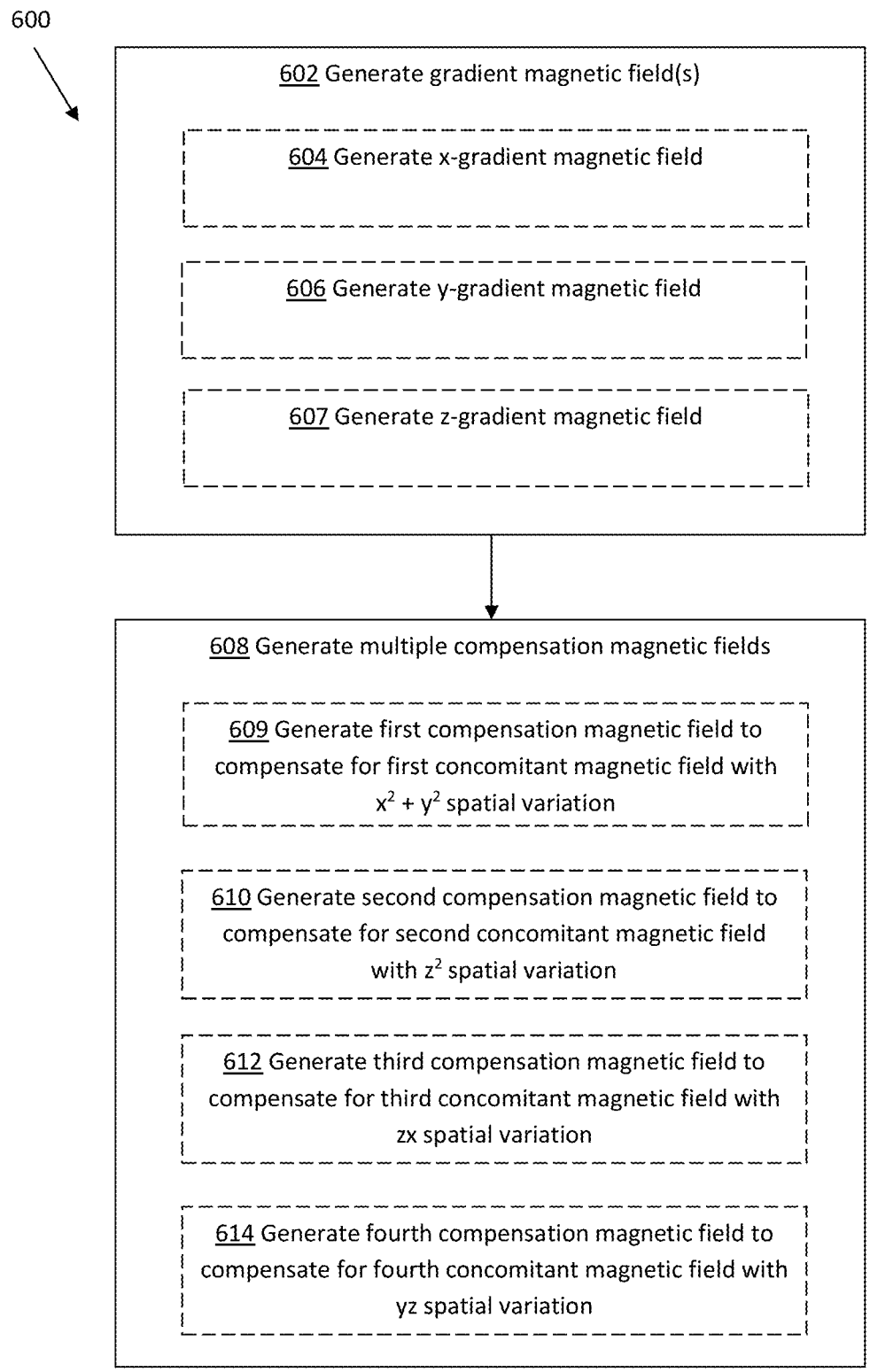
FIG. 6 is a flowchart setting forth the steps of another example method for reducing a higher order term of a concomitant field in an imaging magnetic field during magnetic resonance imaging.

Referring to FIGS. 5 and 6, there are illustrated example methods 500 and 600 for reducing a higher order term of a concomitant field in an imaging magnetic field during magnetic resonance imaging.

In some examples, methods 500 and 600 may be at least in part be performed using MRI system 100 as shown in FIG. 1. Additionally, the following discussion of methods 500 and 600 leads to further understanding of system 100. However, it is to be understood that system 100, and methods 500 and 600, can be varied and need not work exactly as discussed herein in conjunction with each other, and that such variations are within the scope of the appended claims. As well, methods 500 and 600 may be performed independently of each other and/or independently of system 100. Method 500 is described first.

Optionally, at 502, during imaging, the at least one gradient coil is activated to generate one or more gradient magnetic field. As discussed above, field homogeneity may be lacking due to concomitant magnetic fields (for example, if the z-gradient is activated, the second-order $x^2+y^2$ spatial variation may also be present in the magnetic field). As well, if more than one gradient coil is activated, multiple second-order concomitant magnetic fields may be generated.

At 504, therefore, a first compensation magnetic field with a similar amplitude but opposite direction as that of a first second-order concomitant magnetic field is generated with a first shim coil.

Generating the first compensation magnetic field may include designing the second order shim coil that generates that second-order compensation magnetic field. In certain applications, the design and manufacture of the first shim coil may optionally be performed ahead of time, prior to the imaging. For example, to arrive at the $x^2+y^2$ shim coil, a first compensation term with the $x^2+y^2$ spatial variation may be established at 506. The first compensation term may be the magnetic field that is equal in magnitude/amplitude but opposite in direction to that of the concomitant magnetic field with the $x^2+y^2$ spatial variation. The first compensation term may, thus, be mathematically represented by the equation:

$$(G_z^2)/(8*B0)$$

In other words, the first compensation term represents the "target" magnetic field that, when superimposed or merged with the gradient magnetic field in the z direction, nulls or mitigates the concomitant field with the $x^2+y^2$ spatial variation.

As a further option, during the optional design and manufacture of the shim coil, at 508, the first compensation term may be processed with a mutual inductance constraint. Application of the mutual inductance constraint may help to reduce the sensitivity of mutual inductance between the $x^2+y^2$ shim coil and the z-gradient coil, in other words, decouple the $x^2+y^2$ shim coil from the z-gradient coil.

For example, the mutual inductance may be included as a constraint or a weighted parameter through use of a mutual inductance vector representing the mutual inductance of the design surface relative to an array of current elements representing the wire patterns of a target coil. Multiple target coils can be included by multiple weighted parameters or multiple simultaneous constraints. The mutual inductance vector can also be calculated at different small translations (e.g., 1-10 mm) or rotations (e.g., 1-3 degrees) of the design surface and included as constraints or weighted parameters to reduce mutual inductance that may occur due to anticipated construction position tolerances.

In one formulation, the mutual inductance vector, $M_n$, represents the mutual inductance between the finite element surface and a gradient coil 130 or another shim coil wire pattern (e.g., the $x^2+y^2$ shim coil, such as the wire pattern shown in FIG. 2). For example, the mutual inductance vector can be calculated by the formula:

$$M_n \approx \frac{\mu_0}{4\pi I_s} \int_S \int_{S'} \frac{J_{in}(r) \cdot J_s(r')}{|r_{in} - r'_s|} dS' dS$$

where $I_s$ is the current amplitude being driven through the target coil current element array, $J_{in}(r)$ is the set of current basis functions for the finite element surface, $J_s(s')$ is the current density (wire pattern) of the target coil, and $|r_{in}-r'_s|$ is the distance between the node n and the target coil current density.

While one manner of decoupling the $x^2+y^2$ shim coil from the z-gradient coil is described above, other decoupling methods may also or alternately be applied to reduce the mutual inductance between the $x^2+y^2$ shim coil and the z-gradient coil during imaging.

At 510, a $x^2+y^2$ shim coil may then be designed and created to produce the magnetic field represented by the first compensation term, optionally as constrained with the mutual inductance vector discussed above.

To design and create the $x^2+y^2$ shim coil, a performance functional may be formed with the compensation term and the mutual inductance constraint, among other performance metric requirements, to generate a current density pattern for the $x^2+y^2$ shim coil. The performance functional may then be optimized based on the performance metric requirements to get a desired or target current density pattern. Desired coil windings for the $x^2+y^2$ shim coil may then be obtained from the desired current density pattern, and the $x^2+y^2$ shim coil may subsequently be created with the appropriate coil windings.

The $x^2+y^2$ shim coil is driven with a waveform at 512 to generate the first compensation magnetic field. When the $x^2+y^2$ shim coil is driven with the z gradient coil during imaging, the first compensation magnetic field is superimposed or merged with the gradient magnetic field in the z direction, thus nulling or mitigating the concomitant field with the $x^2+y^2$ spatial variation.

While generating the first compensation magnetic field at 504 has been described using the $x^2+y^2$ shim coil as the first shim coil, the other second-order corrections may be performed in a similar manner. The first compensation magnetic field may instead compensate for a concomitant field with a $z^2$ spatial variation using a $z^2$ shim coil, compensate for a concomitant field with a zx spatial variation using a zx shim coil, or compensate for a concomitant field with a yz spatial variation using a yz shim coil.

In other applications, rather than designing a specific electromagnet (or a specific shim coil) to generate the desired current density pattern, the adaptable shim coil, or the matrix coil, may be used in a specific configuration to produce the desired compensation magnetic field. In this manner, the compensation field can be generated in real-time. The matrix coil would receive input and generate a field dynamically according to the input given it.

Method 600 is now described with reference to FIG. 6. At 602, multiple gradient magnetic fields are generated. This may include optionally generating a z-gradient magnetic field at 607, as described above. As understood by the skilled person, during medical resonance imaging, the z gradient coil may be driven alone or in combination with the x gradient coil and/or the y gradient coil at 602.

In certain applications, a gradient magnetic field in the x direction may be optionally generated at 604 and/or a gradient magnetic field in the y direction may be optionally generated at 606. In other words, the x and y gradient coils may also be driven alone or in combination.

In that regard, multiple second-order field terms or higher order concomitant magnetic fields may be present in the imaging magnetic field. Thus, multiple compensation magnetic fields may be generated at 608 to mitigate these multiple second-order concomitant fields. In the example shown in FIG. 6, 609 includes generating the first second-order compensation magnetic field with the $x^2+y^2$ spatial variation when the z-gradient coil is driven.

When the x gradient coil or the y gradient coil is driven, a second compensation magnetic field may be optionally generated at 610, for example with a $z^2$ shim coil, according to a second second-order compensation term. Similar to the first second-order compensation term, the second compensation magnetic field has a similar amplitude but opposite direction as that of the second-order concomitant magnetic field with the $z^2$ spatial variation.

In certain applications, the second second-order compensation term is represented by:

$$(G_x^2 + G_y^2)/(2*B0)$$

The second second-order compensation term represents the "target" magnetic field that, when superimposed or merged with the gradient magnetic field in the x or y direction, nulls or mitigates the second-order concomitant field with the $z^2$ spatial variation.

When the x and z gradient coils are driven at the same time, a third compensation magnetic field may be optionally generated at 612, for example with a zx shim coil, according to a third second-order compensation term. Similar to the first second-order compensation term, the third compensation magnetic field has a similar amplitude but opposite direction as that of the second-order concomitant magnetic field with the zx spatial variation.

In certain applications, the third second-order compensation term is represented by:

$$-G_x*G_z/(2*B0)$$

The third second-order compensation term represents the "target" magnetic field that, when superimposed or merged with the gradient magnetic field in the x and z direction, nulls or mitigates the second-order concomitant field with the zx spatial variation.

When the y and z gradient coils are driven at the same time, a fourth compensation magnetic field may be optionally generated at 614, for example with an yz shim coil, according to a fourth second-order compensation term. Similar to the first second-order compensation term, the fourth compensation magnetic field has a similar amplitude but opposite direction as that of the second-order concomitant magnetic field with the yz spatial variation.

In certain applications, the fourth second-order compensation term is represented by:

$$-G_y*G_z/(2*B0)$$

The fourth second-order compensation term represents the "target" magnetic field that, when superimposed or merged with the gradient magnetic field in the y and z direction, nulls or mitigates the second-order concomitant field with the yz spatial variation.

When the x, y, and z gradient coils are driven at the same time, all four of the above second-order shim coils may be driven as well in order to mitigate or null their respective second-order concomitant fields. In other examples, not all of the second-order shim coils may be driven to generate the compensation magnetic field(s). It should be understood that each second-order shim coil may be independently driven to generate independent compensation magnetic fields, as appropriate, to compensate for respective second-order field terms.

Figure 7:
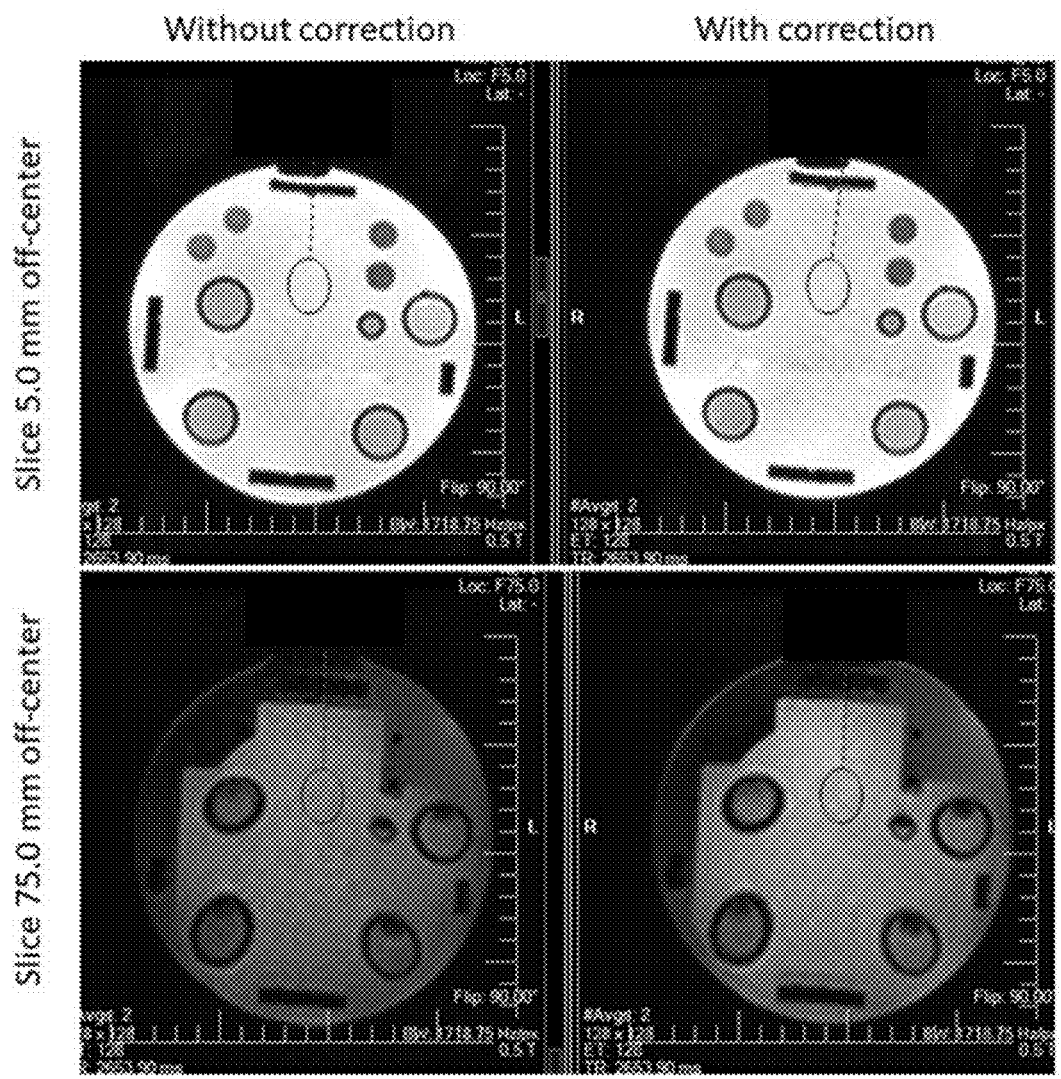
FIG. 7 shows an example of signal dropout caused by concomitant magnetic fields.

FIG. 7 provides an example of the above-discussed compensation effect when using a $z^2$ shim coil. Axial EPI phantom images are shown without (left) and with (right) higher-order concomitant correction (in this case, correction of the $z^2$ term) for a slice 5.0 mm (top) and 75.0 mm (bottom) off isocenter respectively. The images on the right are brighter. For a slice near isocenter (top), the high-order correction does not significantly affect the signal of the phantom. This is indicated by the mean and standard deviation of the signal. Without correction (top left), the mean and standard deviation of the signal is 4796.3 and 109.3, respectively. With correction (top right), the mean and standard deviation of the signal is 4657.7 and 95.2, respectively.

However, for a slice further from isocenter (bottom), the correction increases the signal of the phantom by approximately 25%. Without correction (bottom left), the mean and standard deviation of the signal is 2545.2 and 126.2, respectively. With correction (bottom right), the mean and standard deviation of the signal is 3386.1 and 142.3, respectively. The higher number of the mean for the corrected case illustrates how the correction helps to recover some lost signal due to dropout from the higher order concomitant magnetic fields. As noted above, for an axial EPI image with readout on either the x- or y-gradient axes, the high-order concomitant correction is applied using the $z^2$ shim coil.

As such, when a $x^2+y^2$, zx, yz, and/or $z^2$ concomitant magnetic field is present, it may be compensated for in real-time by running the respective $x^2+y^2$, zx, yz, and/or $z^2$ shim coils such that the two field effects (one due to the concomitant field and one due to the shim coil) cancel each other out.

Generally, there are four second-order concomitant magnetic fields (xy, yz, zx, $x^2+y^2$, and $z^2$), which are generated by a Taylor expansion of the main magnetic field. In a typical second-order active shimming system, there are four second-order electromagnets (xy, yz, zx, $x^2-y^2$, and $z^2$), which are based on a spherical harmonic expansion of the magnetic field. The mismatch in spatial patterns between the two expansions, that is $x^2+y^2$ and $x^2-y^2$ for the concomitant field term and shim field term respectively, necessitates an additional, novel, correction electromagnet for full second-order compensation, i.e. an electromagnet that produces an $x^2+y^2$ spatial pattern. This helps to illustrate the novelty of using the second-order shim coils for concomitant field correction as presently described.

This compensation may be done in real-time, similar to eddy current compensation. This is possible because the amplitude of the concomitant magnetic field terms are well-defined with respect to the gradient coil amplitudes and the main magnetic field.

In some implementations, an advantage of the presently disclosed method and system may be that it is not specific to a particular image orientation. The presently disclosed system and method may provide the desired reduction of concomitant field regardless of the orientation of the image. As well, the presently disclosed solution may require little or no modifications to the post-processing reconstruction method, and may not require the images to be de-rated to achieve artefact free images. This may help to enable faster imaging.

It will be appreciated that the above magnetic field compensation methods and systems may be implemented alone or in combination with other compensation methods and systems, including passive shimming, depending on the type and severity of the field instability.

While the magnetic field compensation described relates to second-order concomitant magnetic fields, the above methods and systems may also be applied to third order, or higher, concomitant magnetic fields.

The effect of the concomitant fields tends to get smaller as the spatial terms get higher in order. However, correction of third order or higher order concomitant magnetic fields may be relevant in applications where the main magnetic field strength is lower.

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as read-only memory (ROM), volatile random access memory (RAM), non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, ROM, RAM, flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software and hardware may be written in assembly language, machine language or firmware as needed.

In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

The invention claimed is:

1. A magnetic resonance imaging (MRI) system comprising:
an electromagnet system for reducing a higher order term of a concomitant field in an imaging magnetic field during magnetic resonance imaging, the electromagnet system having:
a first shim coil configured to be driven to generate a first compensation magnetic field during imaging according to a first second-order compensation term, the first compensation magnetic field having a similar amplitude but opposite direction as that of a first second-order concomitant magnetic field; and
a second shim coil configured to be driven to generate an additional compensation magnetic field during imaging according to an additional second-order compensation term, the additional compensation magnetic field having a similar amplitude but opposite direction as that of an additional second-order concomitant magnetic field;
wherein the first shim coil is an $x^2+y^2$ shim coil and the first second-order concomitant magnetic field has an $x^2+y^2$ spatial variation; and
wherein the second shim coil comprises a $z^2$ shim coil, a zx shim coil, or a yz shim coil,
the $z^2$ shim coil configured to be driven to generate a second compensation magnetic field during imaging according to a second second-order compensation term, the second compensation magnetic field having a similar amplitude but opposite direction as that of a second second-order concomitant magnetic field with a $z^2$ spatial variation, the second compensation magnetic field being the additional compensation magnetic field, the second second-order compensation term being the additional second-order compensation term, and the second second-order concomitant magnetic field being the additional second-order concomitant magnetic field,
the zx shim coil configured to be driven to generate a third compensation magnetic field during imaging according to a third second-order compensation term, the third compensation magnetic field having a similar amplitude but opposite direction as that of a third second-order concomitant magnetic field with a zx spatial variation, the third compensation magnetic field being the additional compensation magnetic field, the third second-order compensation term being the additional second-order compensation term, and the third second-order concomitant magnetic field being the additional second-order concomitant magnetic field, and
the yz shim coil configured to be driven to generate a fourth compensation magnetic field during imaging according to a fourth second-order compensation term, the fourth compensation magnetic field having a similar amplitude but opposite direction as that of a fourth second-order concomitant magnetic field with a yz spatial variation, the fourth compensation magnetic field being the additional compensation magnetic field, the fourth second-order compensation term being the additional second-order compensation term, and the fourth second-order concomitant magnetic field being the additional second-order concomitant magnetic field.

2. The MRI system of claim 1, further comprising a third shim coil and a fourth shim coil, the second, third, and fourth shim coils comprising the $z^2$ shim coil, the zx shim coil, and the yz shim coil, respectively.

3. The MRI system of claim 1, wherein
the second second-order compensation term is $(G_x^2+G_y^2)/(2*B0)$,
the third second-order compensation term is $-G_x*G_z/(2*B0)$, and
the fourth second-order compensation term is $-G_y*G_z/(2*B0)$.

4. The MRI system of claim 1, wherein the first shim coil is a matrix coil.

5. A method for reducing a higher order term of a concomitant field in an imaging magnetic field during magnetic resonance imaging, the method comprising:
generating a first compensation magnetic field with a first shim coil during imaging according to a first second-order compensation term, the first compensation magnetic field having a similar amplitude but opposite direction as that of a first second-order concomitant magnetic field; and
generating an additional compensation magnetic field with a second shim coil during imaging according to an additional second-order compensation term, the additional compensation magnetic field having a similar amplitude but opposite direction as that of an additional second-order concomitant magnetic field;
wherein the first shim coil is an $x^2+y^2$ shim coil and the first second-order concomitant magnetic field has an $x^2+y^2$ spatial variation; and
wherein the additional compensation magnetic field comprises a second, a third, or a fourth compensation magnetic field,
the second compensation magnetic field being generated with a $z^2$ shim coil according to a second second-order compensation term, the second compensation magnetic field having a similar amplitude but opposite direction as that of a second second-order concomitant magnetic field with a $z^2$ spatial variation, the $z^2$ shim coil being the second shim coil, the second second-order compensation term being the additional second-order compensation term, and the second second-order concomitant magnetic field being the additional second-order concomitant magnetic field, the third compensation magnetic field being generated with a zx shim coil according to a third second-order compensation term, the third compensation magnetic field having a similar amplitude but opposite direction as that of a third second-order concomitant magnetic field with a zx spatial variation, the zx shim coil being the second shim coil, the third second-order compensation term being the additional second-order compensation term, and the third second-order concomitant magnetic field being the additional second-order concomitant magnetic field, and the fourth compensation magnetic field being generated with a yz shim coil according to a fourth second-order compensation term, the fourth compensation magnetic field having a similar amplitude but opposite direction as that of a fourth second-order concomitant magnetic field with a yz spatial variation, the yz shim coil being the second shim coil, the fourth second-order compensation term being the additional second-order compensation term, and the fourth second-order concomitant magnetic field being the additional second-order concomitant magnetic field.

6. The method of claim 5, wherein generating the first compensation magnetic field comprises:
designing and creating the $x^2+y^2$ shim coil to produce the compensation magnetic field; and
driving the $x^2+y^2$ shim coil during magnetic resonance imaging.

7. The method of claim 5, wherein
the second second-order compensation term is $(G_x^2+G_y^2)/(2*B0)$,
the third second-order compensation term is $-G_x*G_z/(2*B0)$, and
the fourth second-order compensation term is $-G_y*G_z/(2*B0)$.

8. The method of claim 5, further comprising generating two further additional compensation magnetic fields, the additional compensation magnetic field and the two further additional compensation magnetic fields comprising the second, third, and fourth compensation magnetic fields, respectively.

9. An electromagnet set for reducing a higher order term of a concomitant field in an imaging magnetic field during magnetic resonance imaging, the electromagnet set comprising:
a first electromagnet configured to be driven to generate a first compensation magnetic field during imaging according to a first second-order compensation term, the first compensation magnetic field having a similar amplitude but opposite direction as that of a first second-order concomitant magnetic field;
a second electromagnet configured to be driven to generate an additional compensation magnetic field during imaging according to an additional second-order compensation term, the additional compensation magnetic field having a similar amplitude but opposite direction as that of an additional second-order concomitant magnetic field;
wherein the first electromagnet is an $x^2+y^2$ shim coil for correcting the first second-order concomitant magnetic field with an $x^2+y^2$ spatial variation; and
wherein the second electromagnet is a $z^2$ shim coil, a zx shim coil, or a yz shim coil,
the $z^2$ shim coil configured to be driven to generate a second compensation magnetic field during imaging according to a second second-order compensation term, the second compensation magnetic field having a similar amplitude but opposite direction as that of a second second-order concomitant magnetic field with a $z^2$ spatial variation, the second compensation magnetic field being the additional compensation magnetic field, the second second-order compensation term being the additional second-order compensation term, and the second second-order concomitant magnetic field being the additional second-order concomitant magnetic field,
the zx shim coil configured to be driven to generate a third compensation magnetic field during imaging according to a third second-order compensation term, the third compensation magnetic field having a similar amplitude but opposite direction as that of a third second-order concomitant magnetic field with a zx spatial variation, the third compensation magnetic field being the additional compensation magnetic field, the third second-order compensation term being the additional second-order compensation term, and the third second-order concomitant magnetic field being the additional second-order concomitant magnetic field, and
the yz shim coil configured to be driven to generate a fourth compensation magnetic field during imaging according to a fourth second-order compensation term, the fourth compensation magnetic field having a similar amplitude but opposite direction as that of a fourth second-order concomitant magnetic field with a yz spatial variation, the fourth compensation magnetic field being the additional compensation magnetic field, the fourth second-order compensation term being the additional second-order compensation term, and the fourth second-order concomitant magnetic field being the additional second-order concomitant magnetic field.

10. The electromagnet set of claim 9, further comprising a third electromagnet and a fourth electromagnet, the second, third, and fourth electromagnets comprising the $z^2$ shim coil, the zx shim coil, and the yz shim coil, respectively.

* * * * *